(12) United States Patent
Irwin et al.

(10) Patent No.: US 8,895,848 B2
(45) Date of Patent: Nov. 25, 2014

(54) P-TYPE SEMICONDUCTING NICKEL OXIDE AS AN EFFICIENCY-ENHANCING ANODAL INTERFACIAL LAYER IN BULK HETEROJUNCTION SOLAR CELLS

(75) Inventors: Michael D. Irwin, Chicago, IL (US); Donald B. Buchholz, Woodridge, IL (US); Tobin J. Marks, Evanston, IL (US); Robert P. H. Chang, Glenview, IL (US)

(73) Assignee: Northwestern University, Evanston, IL (US)

( * ) Notice: Subject to any disclaimer, the term of this patent is extended or adjusted under 35 U.S.C. 154(b) by 1352 days.

(21) Appl. No.: 12/191,407

(22) Filed: Aug. 14, 2008

(65) Prior Publication Data

US 2009/0044855 A1    Feb. 19, 2009

Related U.S. Application Data

(60) Provisional application No. 60/965,105, filed on Aug. 17, 2007, provisional application No. 61/033,905, filed on Mar. 5, 2008.

(51) Int. Cl.
| | |
|---|---|
| *H01L 31/00* | (2006.01) |
| *B82Y 10/00* | (2011.01) |
| *H01L 51/44* | (2006.01) |
| *H01L 51/00* | (2006.01) |
| *H01L 51/42* | (2006.01) |

(52) U.S. Cl.
CPC ............ *H01L 51/441* (2013.01); *Y02E 10/549* (2013.01); *C08G 2261/91* (2013.01); *H01L 51/0036* (2013.01); *H01L 2251/308* (2013.01); *C08G 2261/3223* (2013.01); *B82Y 10/00* (2013.01); *C08G 2261/141* (2013.01); *C08G 2261/11* (2013.01); *H01L 51/0048* (2013.01); *H01L 51/4253* (2013.01)
USPC ............................................. 136/263; 136/255

(58) Field of Classification Search
CPC .............. H01L 51/442; H01L 51/4253; H01L 51/4273; H01L 51/0043; H01L 51/0036; H01L 51/0047; Y02E 10/549
USPC .................................................. 136/263, 255
See application file for complete search history.

(56) References Cited

U.S. PATENT DOCUMENTS

| | | | |
|---|---|---|---|
| 6,525,261 B1 | 2/2003 | Kubota et al. | |
| 2002/0119297 A1* | 8/2002 | Forrest et al. | ................. 428/199 |
| 2004/0265629 A1* | 12/2004 | Wang et al. | ................... 428/690 |
| 2005/0123751 A1* | 6/2005 | Tsutsui et al. | ................. 428/364 |
| 2006/0279190 A1* | 12/2006 | Nakayama | .................... 313/113 |
| 2007/0108539 A1 | 5/2007 | Brabec et al. | |

OTHER PUBLICATIONS

Padinger, "Effects of Postproduction Treatment on Plastic Solar Cells", Advanced Functional Materials, pp. 85-88, vol. 13, No. 1, Jan. 2003.*

(Continued)

*Primary Examiner* — Devina Pillay
(74) *Attorney, Agent, or Firm* — Morris, Manning & Martin, LLP; Tim Tingkang Xia, Esq.

(57) ABSTRACT

The present invention, in one aspect, relates to a solar cell. In one embodiment, the solar cell includes an anode, a p-type semiconductor layer formed on the anode, and an active organic layer formed on the p-type semiconductor layer, where the active organic layer has an electron-donating organic material and an electron-accepting organic material.

3 Claims, 11 Drawing Sheets (a)

(b)

(56) References Cited

OTHER PUBLICATIONS

Kyaw, "An inverted organic solar cell employing a sol-gel derived ZnO electron selective layer and thermal evaporated MoO3 hole selective layer", Applied Physics Letters, 93, 221107 2008 pp. 221107-1-221107-8, Dec. 2008.*

Markus C. Scharber et al., Design Rules for Donors in Bulk-Heterojunction Solar Cells-Towards 10% Energy-Conversion Efficiency, Advanced Materials, 2006, p. 789-794, vol. 18.

Daibin Kuang et al., High-Efficiency and Stable Mesoscopic Dye-Sensitized Solar Cells Based on a High Molar Extinction Coefficient Ruthenium Sensitizer and Nonvolatile Electrolyte, Advanced Materials, 2007, p. 1133-1137, vol. 19.

Vishal Shrotriya et a., Accurate Measurement and Characterization of Organic Solar Cells, Advanced Functional Materials, 2006, p. 2016-2023, vol. 16.

Cristian Ionescu-Zanetti et al., Semiconductive Polymer Blends: Correlating Structure with Transport Properties at the Nanoscale, Advanced Materials, Mar. 5, 2004, p. 385-389, vol. 16, No. 5.

S. Hufner et al., Electronic structure of NiO and related 3d-transition-metal compounds, Advances in Physics, 1994, p. 183-356, vol. 43, No. 2.

Marisol Reyes-Reyes et al., High-efficiency photovoltaic devices based on annealed poly(3-hexylthiophene) and 1-(3-methoxycarbonyl)-propyl-1-phenyl-(6,6)C61 blends, Applied Physics Letters, 2005, p. 083506-1-083506-3, vol. 87. No. 8.

Kyungkon Kim et al., Roles of donor and acceptor nanodomains in 6% efficient thermally annealed polymer photovoltaics, Applied Physics Letters, 2007, p. 163511-1-163511-3, vol. 90. No. 16.

Ping He et al., Measurement of thermal conductivity of buried oxides of silicon-on-insulator wafers fabricated by separation by implantation of oxygen technology, Applied Physics Letters, Sep. 2, 2002, p. 18961898, vol. 81, No. 10.

M.S.White et al., Inverted bulk-heterojunction organic photovoltaic device using a solution-derived ZnO underlayer, Applied Physics Letters, 2006, p. 143517-1-143517-3, vol. 89, No. 14.

Vishal Shrotriya et al., Transition metal oxides as the buffer layer for polymer photovoltaic cells, Applied Physics Letters, 2006, p. 073508-1-073508-3. vol. 88, No. 7.

P.S. Patil et al., Preparation and characterization of spray pyrolyzed nickel oxide (NiO) thin films, Applied Surface Science, 2002, p. 211-221, vol. 199.

Serap Günes et al., Conjugated Polymer-Based Organic Solar Cells, Chemical Reviews, 2007, p. 1324-1338, vol. 107, No. 4.

Kohshin Takahashi et al., Efficiency Increase by Insertion of Electrodeposited CuSCN Layer into ITO/Organic Solid Interface in Bulk Hetero-junction Solar Cells Consisting of Polythiophene and Fullerene, Chemistry Letters, 2007, p. 762-763, vol. 36, No. 6.

Tian-An Chen et al., The First Regioregular Head-to-Tail Poly)3-hexylthiophene-2,5-diyl) and a Regiorandom Isopolymer: Ni vs Pd Catalysis of 2(5)-Bromo-5(2)-(bromozincio)-3-hexylthiophene Polymerization, J. Am. Chem. Soc., 1992, p. 10087-10088, vol. 114.

Qinglan Huang et al., Molecularly "engineered" Anode Adsorbates for Probing OLED Interfacial Structure-Charge Injection/Luminance Relationships: Large, Structure-Dependent Effects, J. Am. Chem. Soc., 2003, p. 14704-14705, vol. 125, No. 48.

Kristin L. Mutolo et al., Enhanced open-Circuit Voltage in Subphthalocyanine/C60 organic Photovoltaic Cells, J. Am. Chem. Soc., 2006, p. 8108-8109, vol. 128, No. 25.

Gang Li et al., Investigation of annealing effects and film thickness dependence of polymer solar cells based on poly (3-hexylthiophene), Journal of Applied Physics, 2005, p. 043704-1-043704-5, vol. 98, No. 4.

Sophie E. Gledhill et al., Organic and nano-structured composite photovoltaics: An overview, J. Mater. Res., Dec. 2005, p. 3167-3179, vol. 20, No. 12.

G. Dennler et al., Flexible, conjugated polymer-fullerene-based bulk-heterojunction solar cells: Basics, encapsulation, and integration, J. Mater. Res., Dec. 2005, p. 3224-3233, vol. 20, No. 12.

K. Nakaoka et al., Semiconductor and electrochromic properties of electrochemically deposited nickel oxide films, Journal of Electroanalytical Chemistry, 2004, p. 93-99, vol. 571.

C. Gledel et al., Elaboration and characterization of amorphous V2O5 thin films-silicon p-n junctions, Journal of Materials Science, 1989, p. 2493-2496, vol. 24.

Jan C. Hummelen et al., Preparation and Characterization of Fulleroid and Methanofullerene Derivatives, J. Org. Chem. 1995, p. 532-538, vol. 60, No. 3.

M. Kemerink et al., Three-Dimensional Inhomogeneities in PEDOT:PSS Films, J. Phys. Chem. B, 2004, p. 18820-18825, vol. 108, No. 49.

F Werfel et al., Photoemission study of the electronic structure of Mo and Mo oxides, J. Phys. C: Solid State Phys., 1983, p. 6091-6100, vol. 16.

Jun Ni et al., MOCVD-Derived Highly Transparent, Conductive Zinc-and Tin-Doped Indium Oxide Thin Films: Precursor Synthesis, Metastable Phase Film Growth and Characterization, and Application as Anodes in Polymer Light-Emitting diodes, J. Am. Chem. Soc., 2005, p. 5613-5624, vol. 127, No. 15.

Qinglan Huang et al., Covalently Bound Hole-Injecting Nanostructures. Systematics of Molecular Architecture, Thickness, Saturation, and electron-Blocking Characteristics on organic Light-Emitting Diode Luminance, Turn-on Voltage, and Quantum Efficiency, J. Am. Chem. Soc., 2005, p. 10227-10242, vol. 127, No. 29.

He Yan et al., High-Performance Hole-Transport Layers for Polymer Light-Emitting Diodes. Implementation of Organosiloxane Cross-Linking Chemistry in Polymeric Electroluminescent Devices, J. Am. Chem. Soc., 2005, p. 3172-3183, vol. 127, No. 9.

S. Pizzini et al., Thermodynamic and Transport Properties of Stoichiometric and Nonstoichiometric Nickel Oxide, J. Electrochem. Soc.: Solid State Science, Nov. 1967, p. 1179-1189, vol. 114, No. 11.

Kenneth L. Hardee et al., Semiconductor Electrodes X. Photoelectrochemical Behavior of Several Polycrystalline Metal Oxide Electrodes in Aqueous Solutions, J. Electrochem. Soc.: Electrochemical Science and Technology, Feb. 1977, p. 215-224, vol. 124, No. 2.

Inoue, Kanzan et al., High efficiency P3HT/PCBM solar cell, Materials Research Society Symposium Proceedings, 2005, p. 69-74, vol. 836. Materials Research Society.

Sean E. Shaheen et al., Organic-Based Photovoltaics: Toward Low-Cost Power Generation, Mrs Bulletin, Jan. 2005, p. 10-19, vol. 30.

Michael Grätzel, Dye-Sensitized Solid-State Heterojunction Solar Cells, Mrs Bulletin, Jan. 2005, p. 23-27, vol. 30

Kevin M. Coakley et al., Ordered Organic-Inorganic Bulk Heterojunction Photovoltaic Cells, Mrs Bulletin, Jan. 2005, p. 37-40, vol. 30.

Xiaoniu Yang et al., Nanoscale Morphology of High-Performance Polymer Solar Cells, Nano Letters, 2005, p. 579-583, vol. 5, No. 4.

Oliver Morton et al., A New Day Dawning? Nature, Sep. 2006, p. 19-22. vol. 443, London, United Kingdom.

Gang Li et al., High-efficiency solution processable polymer photovoltaic cells by self-organization of polymer blends, Nature Materials, Nov. 2005, p. 864-868, vol. 4.

Wittenauer, Michael A. et al., Surface conduction versus bulk conduction in pure stoichiometric nickel monoxide crystals, Philosophical Magazine B, 1982, p. 659-667. vol. 46, No. 6.

Atsushi Fujimori et al., Valence-band photoemission and optical absorption in nickel compounds, Physical Review B, Jul. 15, 1984, p. 957-971, vol. 30, No. 2.

David Adler et al., Electrical and Optical Properties of Narrow-Band Materials, Physical Review B, Oct. 15, 1970, p. 3112-3134, vol. 2, No. 8.

Jeffrey M. McKay et al., Surface electronic structure of NiO: Defect states, O2 and H2O interactions, Physical Review B, Nov. 15, 1985, p. 6764-6772, vol. 32, No. 10.

Stephan Lany et al., Origins of the doping asymmetry in oxides: Hole doping in NiO versus electron doping in ZnO. Physical Review B, 2007, p. 241203-1-241203-4, vol. 75, No. 24.

A.H.Madjid et al., Thermionic Emission from Nickel Oxide, Physical Review Letters, May 15, 1972, p. 1313-1315, vol. 28, No. 20.

(56) References Cited

OTHER PUBLICATIONS

Forrest, Stephen R. et al., Organic photovoltaic cells: strategies for increasing solar energy conversion efficiencies, Polym. Mater. Sci. Eng., 2006, p. 95, vol. 160, American Chemical Society.

Hains, Alexander W. et al., Bulk-heterojunction organic solar cells; interfacial engineering routes to increased open-circuit voltage and power conversion efficiency, Polym. Mater. Sci. Eng., 2007, p. 814-815, vol. 96, American Chemical Society.

André Moliton et al., How to model the behaviour of organic photovoltaic cells, Polymer International, 2006, p. 583-600, vol. 55.

L. Jan Anton Koster et al., Modeling of Poly(3-hexylthiophene):Methanofullerene Bulk-Heterojunction Solar Cells, Proc. of Spie, 2006, 61920A/61921-61920A/61929, vol. 6192.

Lira-Cantu et al., Polymer photovoltaics: from conjugated polymers to hybrid organic-inorganic solar cells, Recent Research Developments in Applied Physics, 2005, p. 71-98, vol. 8, Transworld Research Network.

H. Derouiche et al., Impact of the energy difference in LUMO and HOMO of the bulk heterojunctions components on the efficiency of organic solar cells, ScienceDirect: Solar Energy Materials and Solar Cells, 2007, p. 1163-1167, vol. 91.

S. Hüfner et al., The Electronic Structure of NiO Investigated by Photoemission Spectroscopy, Solid State Communications, 1991, p. 869-873, vol. 80, No. 10.

Hiromichi Ohta et al., UV-detector based on pn-heterojunction diode composed of transparent oxide semiconductors, p-NiO / n-ZnO, ScienceDirect: Thin Solid Films, 2003, p. 317-321, vol. 445.

Akihiko Nakasa et al., Fabrication of nickel oxide and Ni-doped indium tin oxide thin films using pyrosol process, ScienceDirect: Thin Solid Films, 2006, p. 240-243, vol. 498.

Yun-Ho Kim et al., Performance and stability of electroluminescent device with self-assembled layers of poly(3,4-ethylenedioxythiophene)-poly(styrenesulfonate) and polyelectrolytes, ScienceDirect: Thin Solid Films, 2006, p. 305-310, vol. 510.

H.C. Im et al., Highly efficient organic light-emitting diodes fabricated utilizing nickel-oxide buffer layers between the anodes and the hole transport layers, ScienceDirect: Thin Solid Films, 2007, p. 5099-5102, vol. 515.

Von N.G. Schmahl et al., Röntgenographische Untersuchungen an den Systemen MgO-CuO und NiO-CuO, Zeitschrift für anorganische und allgemeine chemie, 1964, p. 230-237, vol. 332.

\* cited by examiner

P-TYPE SEMICONDUCTING NICKEL OXIDE AS AN EFFICIENCY-ENHANCING ANODAL INTERFACIAL LAYER IN BULK HETEROJUNCTION SOLAR CELLS

CROSS-REFERENCE TO RELATED PATENT APPLICATION

This application claims priority to and the benefit of, pursuant to 35 U.S.C. §119(e), U.S. provisional patent application Ser. No. 60/965,105, filed Aug. 17, 2007, entitled "p-TYPE SEMICONDUCTING NICKEL OXIDE AS AN EFFICIENCY-ENHANCING ANODAL INTERFACIAL LAYER IN BULK HETEROJUNCTION SOLAR CELLS," by Michael D. Irwin, Donald B. Buchholz, Tobin J. Marks and Robert P. H. Chang, and U.S. provisional patent application Ser. No. 61/033,905, filed Mar. 5, 2008, entitled "p-TYPE SEMICONDUCTING NICKEL OXIDE AS AN EFFICIENCY-ENHANCING ANODAL INTERFACIAL LAYER IN BULK HETEROJUNCTION SOLAR CELLS," by Michael D. Irwin, Donald B. Buchholz, Tobin J. Marks and Robert P. H. Chang, the contents of which are incorporated herein in their entireties by reference.

STATEMENT AS TO RIGHTS UNDER FEDERALLY-SPONSORED RESEARCH

This invention was made with government support under grant number DE-FG02-06ER46320 awarded by the Department of Energy. The government has certain rights in the invention.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[29]" represents the nth reference cited in the reference list. For example, [29] represents the 29th reference cited in the reference list, namely, Hains, A. W., Martinson, A. B. F., Irwin, M. D., Yan, H., & Marks, T. J. (2007) *Polym Mater Sci Eng* 96, 814-815.

FIELD OF THE INVENTION

The present invention relates generally to a photovoltaic device, and more particularly to a bulk heterojunction solar cell that utilizes an interfacial layer of a p-type oxide semiconductor to enhance the cell performance and methods of fabricating same.

BACKGROUND OF THE INVENTION

In a world of ever-increasing energy demands and the need for renewable energy resources, photovoltaics are becoming an increasingly appealing option for energy production [1]. Organic photovoltaic (OPV) cells [2-8] offer a potential alternative to conventional Si solar cells, as exemplified by: i) dye-sensitized cells [9], ii) polymer cells [10], and iii) small-molecule cells [11]. Of these, polymer cells offer the combined attraction of low-cost, light-weight, mechanical flexibility, and amenability to manufacture by high throughput, low-cost, large-area reel-to-reel coating processes. It is expected that such solar cells could be commercially viable if power conversion efficiencies (PCEs) on the order of about 10% were achieved [12]. To date, the highest PCE polymer solar cells have been fabricated with an active layer composed of a blend of regioregular poly(3-hexylthiophene) (P3HT) [13] and the fullerene derivative [6,6]-phenyl-$C_{61}$ butyric acid methyl ester (PCBM) [14]. The P3HT+PCBM blend forms a phase-separated "bulk-heterojunction" (BHJ) nanostructure which provides a large interfacial area for exciton dissociation. When photo-excited, the P3HT material acts as an electron donor and transporter of holes to the cell anode, while the PCBM material acts as an electron acceptor and transporter of electrons to the cell cathode [10, 15-19]. One material limitation of this BHJ design is the less than optimum match of the narrow P3HT:PCBM optical absorption to the solar spectrum [12]. It is also likely that the multiple, poorly understood interfaces represent a more significant and generic performance constraint to this type of solar cells.

Nanoscale engineering of an anode-organic interface has been successfully implemented in organic light-emitting diodes (OLEDs) for enhancing electrode-organic interfacial physical and electrical contact, resulting in reduced turn-on voltage, blocking of misdirected carriers, enhanced thermal durability, and increased current/power efficiency [20-24]. In BHJ OPV cells, interfacial effects probably limit realization of the maximum theoretical open-circuit voltage ($V_{oc}$). It is generally thought that the magnitude of $V_{oc}$ parallels the energetic difference between the highest occupied molecular orbital (HOMO) of the BHJ donor material and the lowest unoccupied molecular orbital (LUMO) of the acceptor material [25-28]. This difference, less the exciton binding energy, defines the theoretical maximum $V_{oc}$, however in actual devices, the output is typically 300 to 500 mV less than this maximum $V_{oc}$. The hypothesized source of this loss is the field-driven nature of the devices, the presence of dark current, and Schottky barriers formed at the interfaces [28]. One way to enhance OPV performance would then be to suppress these losses to the greatest extent possible. An effective electron-blocking layer (EBL)/hole-transporting layer (HTL) may achieve this goal by preventing current leakage and consequent counter-diode formation [29].

FIG. 1a shows schematically a conventional P3HT:PCBM BHJ solar cell 10 including an active layer 14 of P3HT and PCBM formed an anodal layer 12 that is formed on a glass substrate 11, a lithium fluoride (LiF) layer 15 formed on the active layer 14, and an aluminum (Al) cathodal layer 16 formed on the LiF layer 15. The anodal layer 12 is patterned to have two electrically isolated strips 12a and 12b as an anode, while cathodal layer 16 is patterned to have two electrically isolated strips 16a and 16b as a cathode. Both the anode and the cathode are spatially (electrically) separated. Note that inherent to the conventional BHJ cell architecture 10, both the donor and acceptor materials of the active layer 14 are in direct contact with the anode 12, and it is possible for the acceptor material (PCBM) to transfer electrons to the hole-collecting anode, thereby compromising cell efficiency. Typically, for the P3HT:PCBM solar cell, the PCE is about 2.7-2.9%, where PCE is defined in Equation (1):

$$PCE = \frac{P_{out}}{P_{in}} = \frac{V_{oc} J_{sc} FF}{P_{in}} \qquad (1)$$

where $P_{out}$ is the power output of the solar cell, $P_{in}$ is the power of incident light source (mW/cm$^2$), and $J_{sc}$ is the short-circuit current density (mA/cm$^2$) of the solar cell.

To prevent electron leakage from the BHJ acceptor to the anode, to aid in photogenerated hole extraction, and to planarize the ITO surface, a thin semiconducting poly(3,4-ethylenedioxythiophene):poly(styrenesulfonate) (PEDOT:PSS) electron-blocking layer (EBL) is typically spin-cast as an aqueous dispersion onto the ITO prior to active layer deposition. This device design has achieved confirmed power efficiencies up to 4% [10]. Despite these positive characteristics, note that aqueous PEDOT:PSS dispersions are at pH about 1 and corrosive to the ITO anode [30, 31]. Furthermore, many researchers find that PEDOT:PSS depositions yield inconsistent film morphologies and electrical properties in accord with the demonstrated electrical inhomogeneity of the films [32, 33]. Finally, polymer light-emitting diode results show that PEDOT:PSS is an inefficient electron-blocking layer, reducing device current efficiency due to electron leakage to the anode [21, 22, 24, 30]. This combination of limitations motivates replacement of PEDOT:PSS by a more suitable material for optimum OPV performance.

Therefore, a heretofore unaddressed need exists in the art to address the aforementioned deficiencies and inadequacies.

SUMMARY OF THE INVENTION

In one aspect, the present invention relates to a solar cell. In one embodiment, the solar cell has a transparent substrate; a tin-doped indium oxide (ITO) anode formed on the transparent substrate; an NiO layer formed on the ITO anode; and an active organic layer formed on the NiO layer, the active organic layer comprising P3HT and PCBM; an LiF layer formed on the active organic layer; and a metallic cathode formed on the LiF layer, wherein in one embodiment the metallic cathode is an Al cathode.

The NiO layer is a p-type semiconductor layer that is transparent and adapted for blocking electrons leakage from the active organic layer to the ITO anode while transporting holes from the active organic layer to the ITO anode. In one embodiment, the NiO layer has a thickness of about 1-100 nm, preferably, about 5-80 nm. The ratio of P3HT to PCBM in the active organic layer is about 1:1 in weight.

In another aspect, the present invention relates to a solar cell. In one embodiment, the solar cell includes an anode; a p-type semiconductor layer formed on the anode; and an active organic layer formed on the p-type semiconductor layer, the active organic layer comprising an electron-donating organic material and an electron-accepting organic material, where the p-type semiconductor layer is transparent and adapted for blocking electrons leakage from the active organic layer to the anode while transporting holes from the active organic layer to the anode. Furthermore, the solar cell includes an LiF layer formed on the active organic layer; and a cathode formed on the LiF layer.

In one embodiment, the cathode is formed of a metal, wherein the metal comprises aluminum (Al), titanium (Ti), tungsten (W), silver (Ag), gold (Au) or the like. The anode is transparent and formed of tin-doped indium oxide.

The p-type semiconductor layer has a thickness of about 1-100 nm, preferably, about 5-80 nm. In one embodiment, the p-type semiconductor layer includes a nickel(II) oxide (NiO), or titanium(IV) oxide ($TiO_2$).

In one embodiment, the electron-donating organic material comprises poly(3-hexylthiophene) (P3HT), poly(2-methoxy-5-(3',7'-dimethyl-octyloxy))-p-phenylene vinylene (MDMO-PPV), poly(2,7-(9-(2'-ethylhexyl)-9-hexyl-fluorene)-alt-5,5-(4',7'-di-2-thienyl-2',1',3'-benzothiadiazole)) (PFDTBT), poly(2,6-(4,4-bis-(2-ethylhexyl)-4H-cyclopenta (2,1-b;3,4-6')dithiophene)-alt-4,7-(2,1,3-benzothiadiazole)) (PCPDTBT), or poly(pphenylene-ethynylene)-alt-poly(p-phenylene-vinylene) (PPE-PPV), and the electron-accepting organic material includes PCBM. The ratio of the electron-donating organic material to the electron-accepting organic material in the active organic layer, in one embodiment, is about 1:1 in weight.

A solar cell device can be formed with a plurality of such solar cells that are configured to be in a stack.

In yet another aspect, the present invention relates to a method of fabricating a solar cell. In one embodiment, the method includes the steps of preparing a solution containing P3HT and PCBM; providing a substrate having an ITO coated layer; patterning the ITO coated layer into at least two spatially separated strips to form an anode; depositing an NiO onto the patterned ITO-coated substrate to form an NiO layer thereon; spin-coating the solution onto the NiO layer to form an active organic layer; vapor-depositing an LiF onto the active organic layer; and forming a metallic cathode on the LiF layer.

In one embodiment, the preparing step comprises the steps of mixing the amount of P3HT and the amount of PCBM in purified o-dichlorobenzene to form a mixture; stirring the mixture for about 6-18 hours at a temperature about 50° C. in a dark environment with nitrogen; and sonicating the mixture for about 0.5-2 hours at a temperature about 50° C. to form the solution containing P3HT and PCBM.

In one embodiment, the step of depositing NiO is performed with pulsed-laser deposition (PLD) in an environment having an ambient $O_2$ atmosphere at a pressure between about $1 \times 10^{-2}$-$5 \times 10^{-5}$ Torr. In another embodiment, the step of depositing NiO is performed with an ion-assisted deposition (IAD).

The spin-coating step is performed in a nitrogen-filled glove box at about 450-650 rpm for about 40-80 seconds, and then about 1900-2100 rpm for about 0.5-2 seconds, and wherein the spin-coating step further comprises the step of annealing the spin-coated active organic layer in the nitrogen-filled glove box at about 100-140° C. for about 5-15 min.

In one embodiment, the step of forming a metallic cathode on the LiF layer comprises the step of forming an aluminum (Al) cathode on the LiF layer, where the Al cathode is formed to have at least two spatially separated Al strips perpendicular to the at least two spatially separated anode strips.

Additionally, the method may include the step of encapsulating the solar cells with a glass slide using UV-curable epoxy that is cured in a UV chamber inside the nitrogen-filled glove box.

In a further aspect, the present invention relates to a method of fabricating a solar cell. In one embodiment, the method has the steps of forming an anode on a transparent substrate; forming a p-type semiconductor layer on the anode; and forming an active organic layer formed on the p-type semiconductor layer, wherein the active organic layer comprises an electron-donating organic material and an electron-accepting organic material. The p-type semiconductor layer is transparent and adapted for blocking electrons leakage from the active organic layer to the anode while transporting holes from the active organic layer to the anode. The p-type semiconductor layer has a thickness of about 1-100 nm, preferably, about 5-80 nm. In one embodiment, the p-type semiconductor layer comprises an NiO or $TiO_2$.

In one embodiment, the electron-donating organic material comprises P3HT, MDMO-PPV, PFDTBT, PCPDTBT, or PPE-PPV, and the electron-accepting organic material includes PCBM.

In one embodiment, the anode is transparent and formed of tin-doped indium oxide.

Furthermore, the method includes the steps of forming an LiF layer on the active organic layer; and forming a cathode on the LiF layer.

Moreover, a solar cell device can be formed with a plurality of solar cells in a stack, where each of the plurality of solar cells is formed by the method immediately set forth above.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
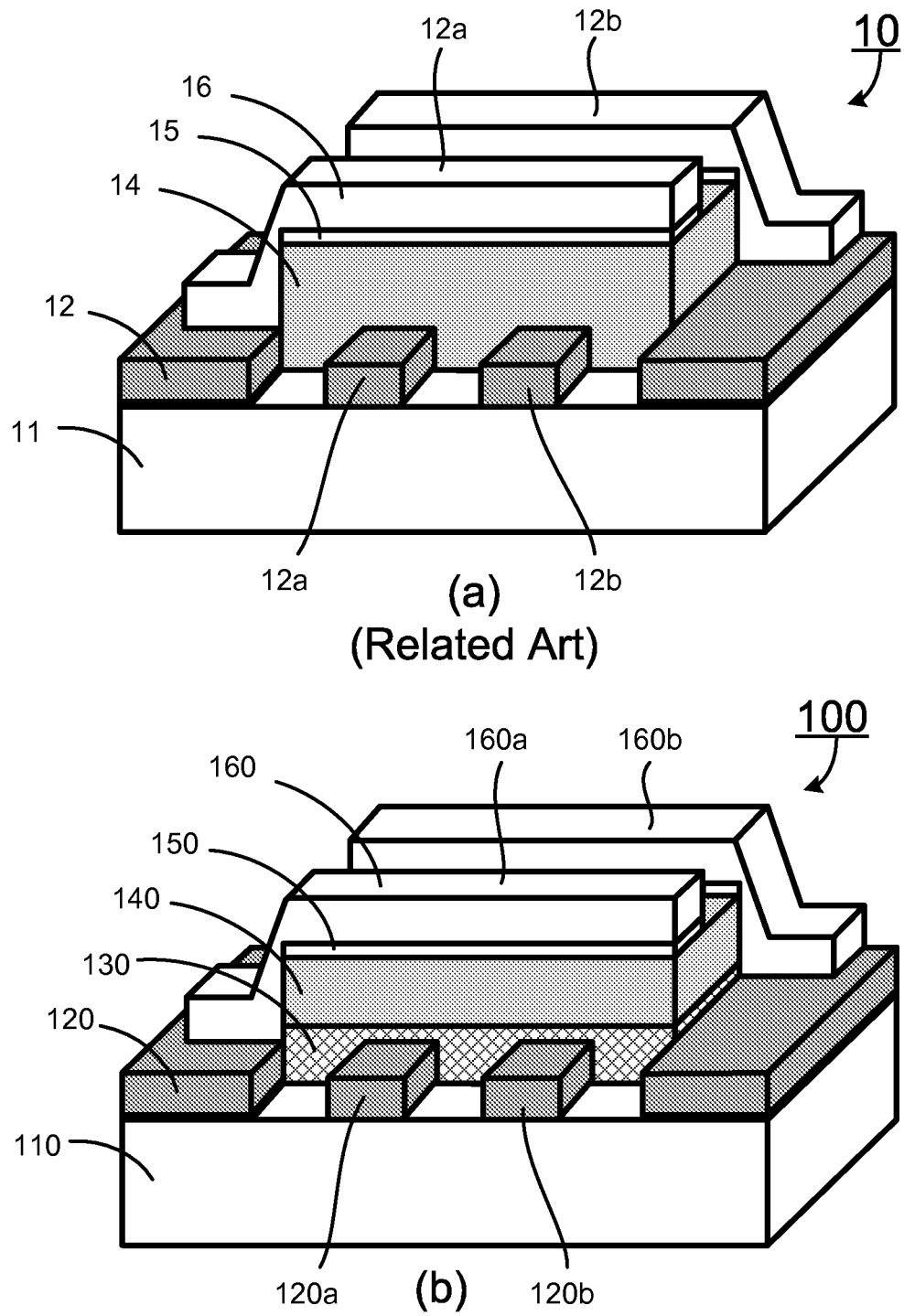
FIG. 1 shows schematically in part bulk-heterojunction (BHJ) solar cells (devices) (a) without and (b) with an interfacial electron-blocking/hole-transporting layer (EBL/HTL) according to one embodiment of the present invention.
Figure 2:
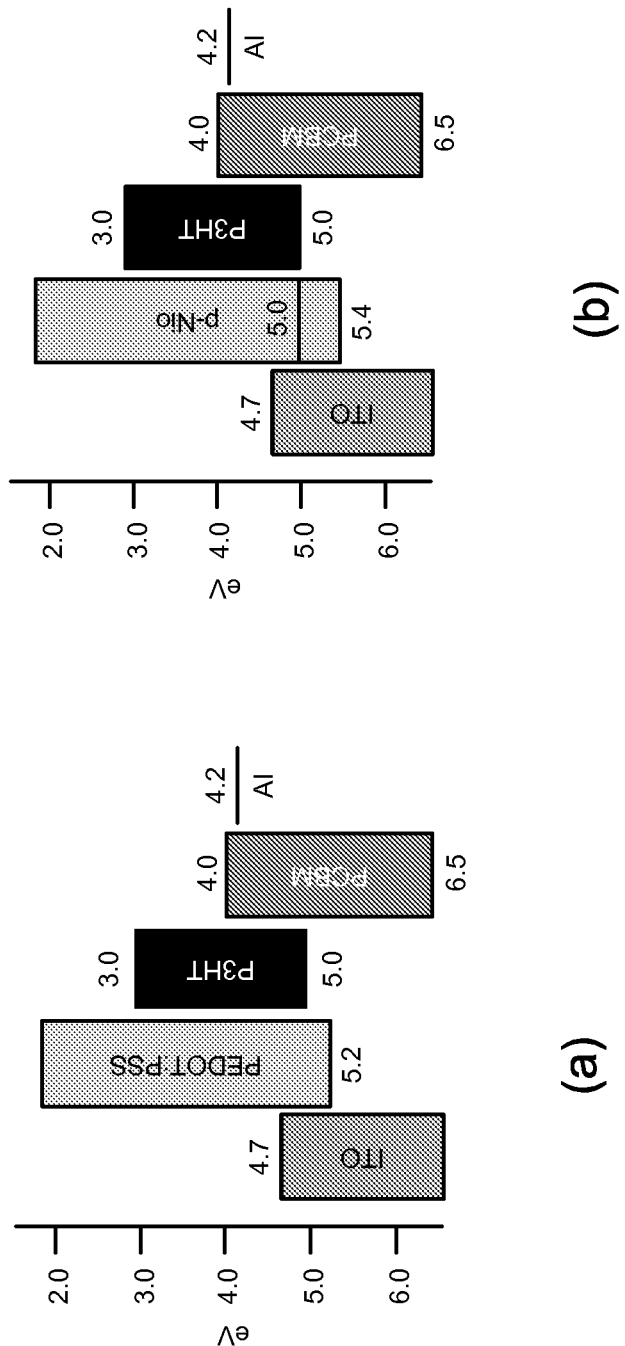
FIG. 2 shows schematically energy level diagrams of BHJ solar cells with (a) an interfacial HTL of PEDOT:PSS, and (b) an interfacial EBL/HTL of NiO according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "open-circuit voltage" refers to the difference of electrical potential between two terminals of a device when there is no external load connected, i.e., the circuit is broken or open. Under these conditions there is no external electric current flow between the terminals, although there may be current flow internally (e.g., self-discharge currents in batteries). The open-circuit voltage of solar cells are often quoted under particular conditions (state-of-charge, illumination, temperature, etc.). Usually, the energetic difference between the HOMO of the donor material and the LUMO of the acceptor material in a solar cell defines the theoretical maximum open-circuit voltage, $V_{oc}$. The difference is less than the exciton binding energy.

The term "fill factor" or its acronym "FF", as used herein, refers to the ratio of the maximum power ($V_{mp} \times J_{mp}$) divided by the short-circuit current density ($J_{sc}$) and open-circuit voltage ($V_{oc}$) in light current density-voltage (J-V) characteristics of solar cells. The open circuit voltage ($V_{oc}$) is the maximum voltage obtainable at the load under open-circuit conditions. The short circuit current density ($J_{sc}$) is the maximum current through the load under short-circuit conditions.

As used herein, the term "ohmic contact" refers to a region on a semiconductor device that has been prepared so that the current-voltage (I-V) curve of the device is linear and symmetric. If the I-V characteristic is non-linear and asymmetric, the contact can instead be termed as a blocking or Schottky contact. Typical ohmic contacts on semiconductors are sputtered or evaporated metal pads that are patterned using photolithography.

Overview of the Invention

Realistic PEDOT:PSS replacements are subject to several fundamental constraints: 1) Sufficient optical transparency to allow solar photons access to the active layer, requiring wide band-gap semiconductors ($E_{gap}$>3 eV) transparent in the visible spectral region. 2) Effective blocking of electron leakage to the anode while efficiently transporting holes to the anode. This capability would address the aforementioned shortcoming of BHJ cells having both donor and acceptor active layer materials in direct contact with both electrodes. All other things being equal, a wide band-gap p-type semiconductor should be far more resistive to electron than to hole transport provided that the conduction band minimum (CBM) is sufficiently above the LUMO of the organic donor (and hence also organic acceptor) material. 3) Appropriate energy level alignment to allow ohmic contact to the donor material. 4) Ambient chemical stability and inertness with respect to the adjacent device layers [34-36].

The present invention provides, among other things, a bulk heterojunction solar cell that utilizes an interfacial layer of a p-type oxide semiconductor to enhance the cell performance and methods of fabricating same.

The description will be made as to the embodiments of the present invention in conjunction with the accompanying drawings of FIGS. 1-11. In accordance with the purposes of this invention, as embodied and broadly described herein, this invention, in one aspect, relates to a BHJ solar cell that utilizes an interfacial layer of a p-type oxide semiconductor for enhancing the cell power conversion efficiency, the fill factor and the open-circuit voltage.

Referring to FIG. 1b, a BHJ solar cell 100 is shown according to one embodiment of the present invention. The solar cell 100 includes an anodal layer 120 formed on a transparent substrate 110 such as glass, a p-type semiconductor layer 130 formed on the anodal layer 120; and an active organic layer 140 formed on the p-type semiconductor layer 130.

The active organic layer 140 is formed of an electron-donating organic material and an electron-accepting organic material. In one embodiment, the electron-donating organic material includes P3HT and the electron-accepting organic material includes PCBM. The ratio of P3HT to PCBM in the active organic layer, in one embodiment, is about 1:1 in weight. Other electron-donating such as MDMO-PPV, PFDTBT, PCPDTBT, PPE-PPV or the like and other electron-accepting organic materials can also be utilized to practice the present invention.

The p-type semiconductor layer 130 is transparent and adapted for blocking electrons leakage from the active organic layer 140 to the anode 120 while transporting holes from the active organic layer 140 to the anodal layer 120. The p-type semiconductor layer has a thickness of about 1-100 nm, preferably, about 5-80 nm. In one embodiment, the p-type semiconductor layer includes an NiO. The NiO, a cubic wide band-gap semiconductor, is essentially transparent when formed in a very thin layer and is a p-type semiconductor capable of facilitating hole conduction (transportation) (i.e., acts as a HTL) [37-39]. Other p-type semiconductors, such as $TiO_2$, or the like, can also be utilized to practice the present invention. Previously, Yang et al. used n-type $V_2O_5$ [40, 41] and $MoO_3$ [42] as interfacial layers in BHJ OPVs, however reported efficiencies of the BHJ OPVs were less than those for optimized PEDOT:PSS-based devices [34]. As discussed below, the p-type semiconductor of NiO has a band structure well-suited for P3HT:PCBM OPVs and provides an ohmic contact to P3HT while having a sufficiently high CBM to function as an EBL. The NiO can be easily deposited to form a thin film (layer), which makes it an effective PEDOT:PSS replacement in BHJ solar cells. According to the present invention, incorporating an interfacial layer of NiO into a BHJ solar cell results in both exceptional fill factor (FF) and open-circuit voltage ($V_{oc}$) metrics, as well as a cell power conversion efficiency of 5.2%.

Furthermore, the solar cell 100 also includes an LiF layer 150 formed on the active organic layer 140 and a cathodal layer 160 formed on the LiF layer 150. LiF is capable of transmitting ultraviolet radiation more efficiently than any other substance. In one embodiment, the cathode is formed of a metal, the metal including Al, titanium (Ti), tungsten (W), silver (Ag), gold (Au) or the like. The anode is transparent and formed of tin-doped indium oxide or the like. Additionally, the anodal layer 120 may be patterned into two or more spatially (electrically) separated strips 120a and 120b as an anode, and the cathode 160 may be formed into two or more spatially (electrically) separated strips 160a and 160b perpendicular to the two or more spatially separated strips 120a and 120b, as a cathode. Both the anode and the cathode are spatially (electrically) separated.

The solar cell can be easily fabricated according to the following steps: at first, a solution containing P3HT and PCBM is prepared and a substrate having an ITO coated layer is provided. For the solution preparation, the amount of P3HT and the amount of PCBM is mixed in purified o-dichlorobenzene to form a mixture. The mixture is stirred for about 6-18 hours at a temperature about 50° C. in a dark environment with nitrogen, and then sonicated for about 0.5-2 hours at a temperature about 50° C. to form the solution containing P3HT and PCBM.

Next, the ITO coated layer is patterned into at least two spatially separated strips to form an anode. A p-type semiconductor of NiO is then deposited onto the patterned ITO-coated substrate using the PLD to form an NiO layer thereon. On the NiO layer, the solution is spin-coated onto the NiO layer to form an active organic layer thereon. In one embodiment, the step of depositing NiO is performed in an environment having an ambient $O_2$ atmosphere at a pressure between about $1\times10^{-2}$-$5\times10^{-5}$ Torr. The spin-coating step is performed in a nitrogen-filled glove box at about 450-650 rpm for about 40-80 seconds, and then about 1900-2100 rpm for about 0.5-2 seconds. The spin-coated active organic layer is annealed in the nitrogen-filled glove box at about 100-140° C. for about 5-15 min. Other deposition methods/processes can also be utilized in practice the present invention. For example, in one embodiment, the p-type semiconductor of NiO can be deposited onto the patterned ITO-coated substrate using the IAD to form the NiO layer thereon.

Sequentially, an LiF layer is vapor-deposited onto the active organic layer, and an Al cathode is formed on the LiF layer. In one embodiment, the Al cathode is formed to have at least two spatially separated Al strips perpendicular to the at least two spatially separated anode strips.

Additionally, the solar cell may be encapsulated with a glass slide using UV-curable epoxy that is cured in a UV chamber inside the nitrogen-filled glove box.

These and other aspects of the present invention are more specifically described below.

IMPLEMENTATIONS AND EXAMPLES OF THE INVENTION

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

In this exemplary example, a bulk heterojunction ITO/NiO/P3HT:PCBM/LiF/Al solar cell is fabricated and characterized according to one embodiment of the present invention. The insertion of the interfacial NiO layer affords cell power conversion efficiencies as high as 5.2%, and enhances the fill factor (FF) to 69% and the open-circuit voltage ($V_{oc}$) to 638 mV versus an ITO/P3HT:PCBM/LiF/Al control device.

Materials: PCBM was purchased from American Dye Source, Inc. (Quebec, Canada) and was further purified by several cycles of sonication in toluene followed by filtration, and then sonication in pentane, followed by centrifugation. P3HT was purchased from Rieke Metals, Inc. (Lincoln, Nebr.) and was further purified by sequential Soxhlet extractions with methanol and hexanes.

Substrate Preparation: ITO-coated glass substrate (about 10 Ω/□) was purchased from Delta Technologies, Inc., Conway, Ark. in a 25×75 mm strip. The substrate was patterned to make two electrically separated 3 mm strips by applying a mask and dipping in hot concentrated HCl for about 10 sec. The substrate was then quenched in a saturated $NaHCO_3$ solution, dried, and sonicated in hexanes at about 50° C. for about 30 min. Next, the ITO-coated glass substrate was cut into 25×12.5 mm substrates and cleaned by sonicating in a 50° C. aqueous detergent for about 30 min, then in DI water for about 5 min., and finally in methanol, isopropanol, and acetone, each for about 30 min. The solvent-cleaned substrates were further cleaned, immediately before use, in a UV-ozone cleaner for about 10 min under ambient atmosphere.

NiO Layer Growth: NiO layers (films) were grown by the PLD. In this exemplary embodiment, a 248 nm KrF excimer laser with a 25-ns duration and a repetition rate of 2-5 Hz was used for the PLD. The 230 mJ/pulse beam was focused onto a 1×2 mm spot on the NiO target. The target, about 25 mm in diameter, was rotated at 5 rpm to prevent localized heating, and the laser pulses were swept cyclically across the target radius to additionally prevent localized heating. The target-substrate separation was fixed at about 10 cm. An ambient $O_2$ atmosphere at a pressure between $1 \times 10^{-2}$-$5 \times 10^{-5}$ Torr was maintained during the NiO film deposition. The same system configuration was also used for the deposition of gold contacts from a metallic gold target: about 13 mm diameter target; 5 Hz; 135 mJ/pulse; the deposition ambient was $5 \times 10^{-3}$ Torr argon. Other deposition methods/processes can also be utilized in practice the present invention. For example, the NiO films can be grown by the Ion-Assisted Deposition (IAD).

Patterned NiO films were fabricated either by shadow mask or by pre-patterning the substrates with AZ-1518 photoresist and post-deposition lift-off. Films patterned by shadow mask were used in the fabrication of solar cells. Films patterned with AZ-1518 were used for step-edge film thickness measurements and fabrication of NiO/n-Si diode-structures. Film thicknesses were measured with a Tencor P-10 profilometer. NiO film crystallinity was examined by glancing-angle (ω=0.4°) θ-2θ scan x-ray diffractometry on a computer-interfaced Rigaku ATX-G instrument using Ni-filtered Cu Kα radiation. Current-voltage characterization of NiO/n-Si diode-structures was performed with a Keithley 237 source-meter. Optical transparency was measured with a Varian Instruments Cary 1E spectrophotometer in dual-beam transmission (T) mode. A Hitachi S4800 instrument was used for SEM imaging and a ThermoMicroscopes CP Research instrument for AFM imaging in the tapping mode.

BHJ Solar Cell Fabrication: A solution of P3HT (20 mg) and PCBM (20 mg) was prepared in purified o-dichlorobenzene (1.0 mL, distilled from $P_2O_5$) one day before the fabrication. The solution was stirred overnight in the dark at about 50° C. under nitrogen and was then sonicated at about 50° C. for about 1 hr the next day. The active layer solution and the cleaned substrates were immediately transferred to a nitrogen-filled glove box (<1 ppm $O_2$ and $H_2O$), the active layer solution was spin-coated onto bare ITO or the ITO/NiO anodes at about 550 rpm for about 60 sec, then about 2000 rpm for about 1 sec. The active layer has a thickness about 210-230 nm. Contact areas were cleaned with dry toluene and a cotton swab, and the films were then annealed on a hot plate in the glove box at 120° C. for 10 min. In the glove box, LiF/Al (0.6 nm/130 nm) cathodes were next deposited sequentially without breaking vacuum using a thermal evaporator. The rates used were 0.1 Å/s for LiF (Acros, 99.98%) and about 2 Å/s for Al (Sigma-Aldrich, 99.999%), with a chamber pressure of $1.1 \times 10^{-6}$ Torr. The cathodes were deposited through a shadow mask with two 2.0 mm strips perpendicular to the two patterned ITO strips to make four solar cells per substrate. Finally, the completed solar cells were encapsulated with a glass slide using UV-curable epoxy (ELC-2500, Electro-Lite Corp., Bethel, Conn.) which was cured in a UV chamber inside the glove box.

BHJ Solar Cell I-V Characterization: Device evaluation was performed at 298K using a Class A Spectra-Nova Technologies solar cell analyzer having a xenon lamp that simulates AM1.5G light at a wavelength of about 400-1100 nm. The instrument was calibrated with a monocrystalline Si diode fitted with a KG3 filter to bring spectral mismatch to unity. The calibration standard was calibrated by the National Renewable Energy Laboratory (NREL). Four-point contacts were made to the substrate with Ag paste and copper alligator clips [28, 54]. Individual devices were isolated by a mask during testing to avoid current collection from adjacent devices and edge effects. A device fabricated and tested on the above instrument having the structure glass/ITO/PEDOT:PSS/P3HT:PCBM/LiF/Al exhibited a $J_{sc}$=9.5 mA/cm$^2$, in agreement with the literature [10]. Devices containing 20 nm NiO interlayer where tested at NREL and the results mirrored those obtained at Northwestern University.

Results and Discussions: As discussed above and shown in FIG. 1b, the BHJ solar cell 100 according to one embodiment of the present invention has an active organic layer 140 formed of P3HT and PCBM, and a tin-doped indium oxide anode 120, and an NiO layer 130 formed therebetween. The NiO layer is the p-type semiconductor interfacial layer. The ITO anode 120 is formed on a glass substrate 110. Additionally, an LiF layer 150 is formed on the active organic layer 140 and an Al cathode 160 is formed the LiF layer 150. In the solar cell 100, P3HT and PCBM are employed as the donor and acceptor material, respectively. The relevant energy levels of the solar cell is shown in FIG. 2b. Although arguably the most studied and modeled of binary transition metal oxides, details of the band structure, band-gap ($E_g$), Fermi level ($E_f$), conduction band minimum (CBM), valence band maximum (VBM), and conduction mechanism continue to stimulate discussion [39, 43-45]. Near-stoichiometric NiO has a room temperature conductivity of about $10^{-12}$ S/cm [45], however $Ni^{2+}$ vacancies are readily formed in undoped NiO which substantially increase the conductivity [39, 46], and films with conductivities of about $10^{-3}$ to $10^{-4}$ S/cm have been reported [47]. Additional discussion of the energy level orderings is presented below.

Figure 3:
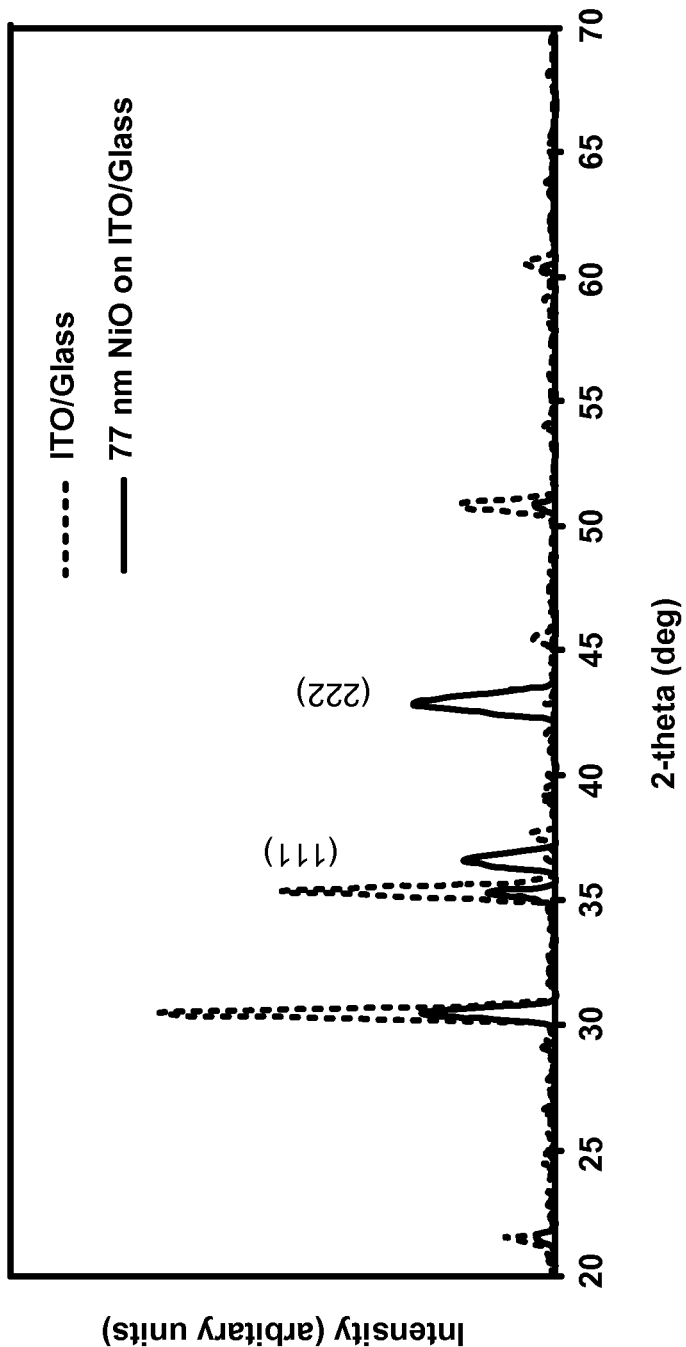
FIG. 3 shows angle x-ray diffraction patterns of an NiO film grown on an ITO/glass substrate and an ITO/glass background. Features are labeled with the corresponding (hkl) reflections of cubic phase NiO.
Figure 4:
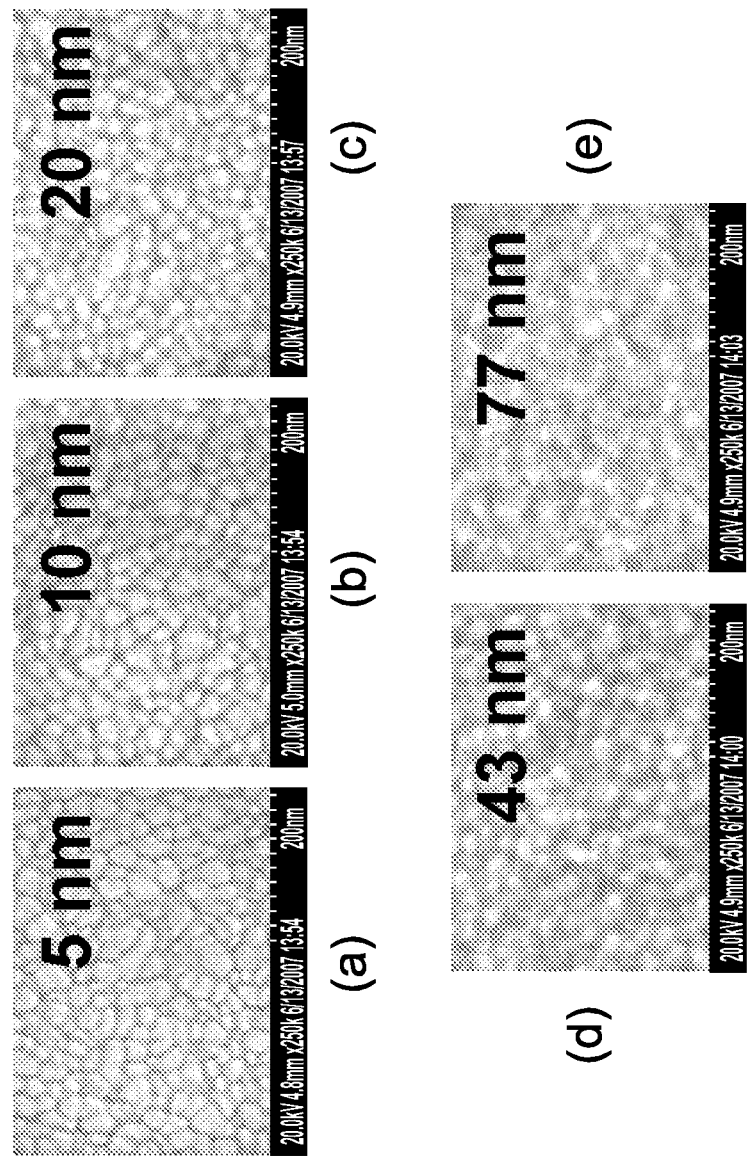
FIG. 4 shows SEM images of NiO films having varying thicknesses grown by pulsed laser deposition (PLD) on glass/ITO substrates.
Figure 5:
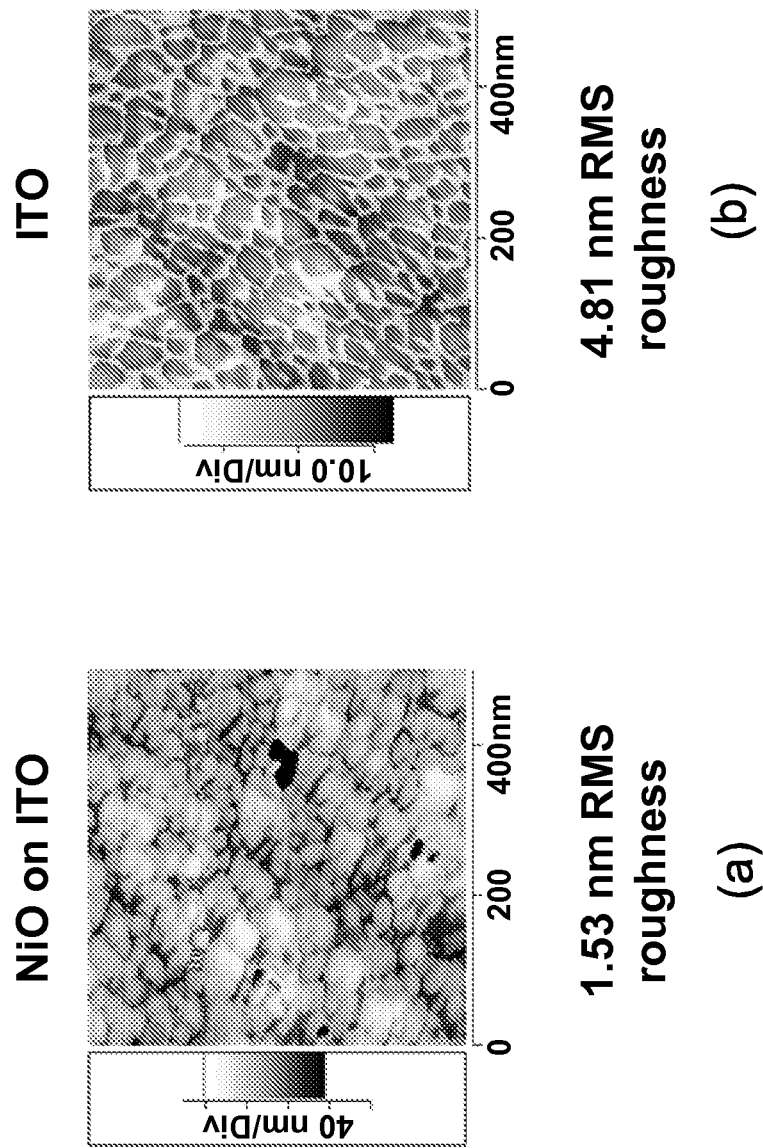
FIG. 5 shows tapping-mode AFM images of an NiO film with a 10 nm thickness grown on a glass/ITO substrate and of a bare glass/ITO substrate. Both surfaces of the glass/ITO/NiO substrate and the glass/ITO substrate had been cleaned by UV-ozone for about 10 minutes prior to scanning.

The thin layer of p-type NiO was deposited by PLD on the patterned ITO anode. The presence of crystalline NiO was confirmed by glancing angle x-ray diffraction (GA-XRD), as shown in FIG. 3. The characteristic NiO (111) and (200) reflections are clearly visible along with the ITO background [44]. The morphology of the NiO surface was evaluated by SEM and AFM. FIG. 4 shows SEM images of the NiO films having varying thicknesses: (a) 5 nm, (b) 10 nm, (c) 20 nm, (d) 43 nm and (e) 77 nm. FIG. 5 shows tapping-mode AFM images of an NiO film with a thickness of about 10 nm grown on a glass/ITO substrate (a) and of a bare glass/ITO substrate (b). Both surfaces of the glass/ITO/NiO substrate and the glass/ITO substrate had been cleaned by UV-ozone for about 10 minutes prior to scanning. The AFM and SEM images reveal distinct grains remarkably similar to those of the ITO surface, as expected. The NiO deposition process significantly planarizes the anode surface from an RMS roughness of about 4-5 nm for the bare glass/ITO substrate to about 1.0-1.5 nm for the glass/ITO/NiO substrate.

Figure 6:
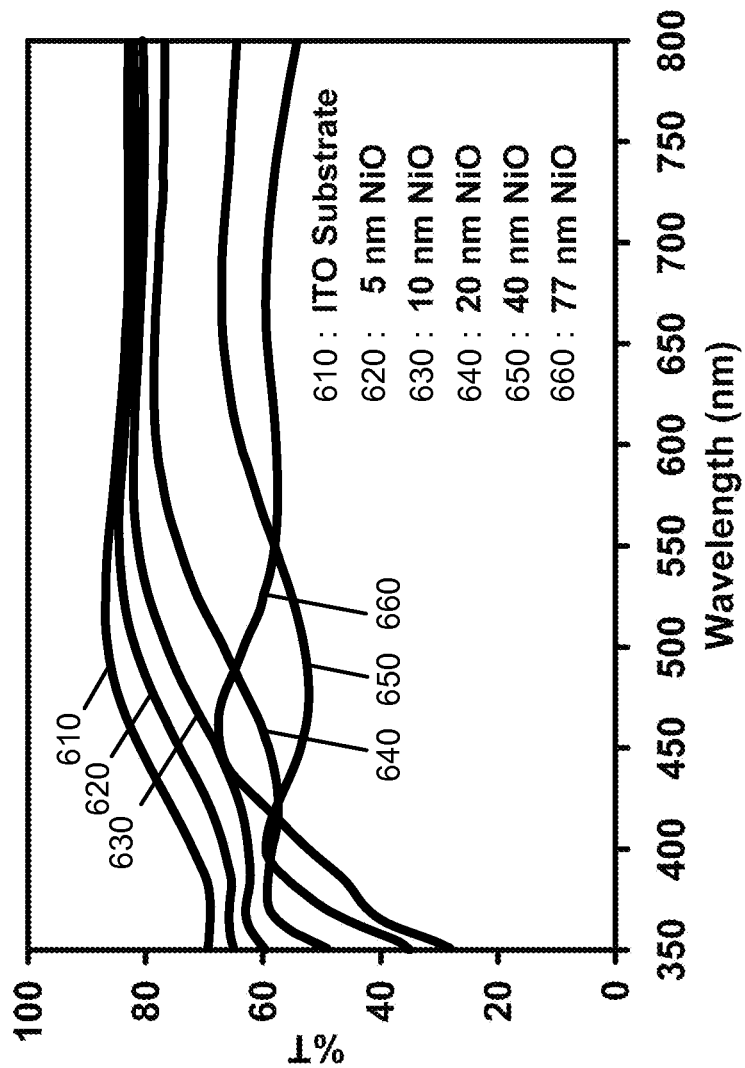
FIG. 6 shows optical transmission spectra of various thickness NiO films grown on an ITO/glass substrate. The ITO/glass substrate is included as the blank (control).

FIG. 6 shows optical transmission spectra 620, 630, 640, 650 and 660 of the NiO films grown on an ITO/glass substrate, with different thickness, 5 nm, 19 nm, 20 nm, 40 nm and 77 nm, respectively. The optical transmission spectrum 610 is for the ITO/glass substrate. From these spectra, PLD-deposited NiO films on the ITO are found to be highly transparent for 5-10 nm layers and should allow the maximum photon flux to reach the active layer for photo-current generation.

Figure 7:
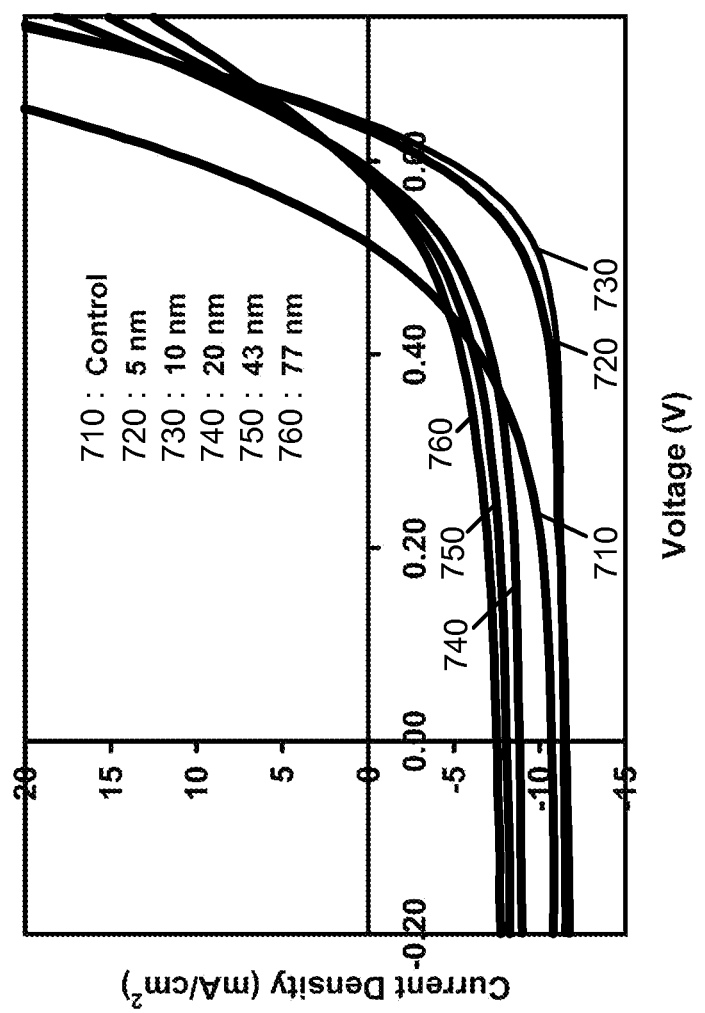
FIG. 7 shows current density-voltage (J-V) plots for glass/ITO/NiO/P3HT:PCBM/LiF/Al BHJ solar cells fabricated with varying layer thicknesses of NiO on the ITO anode. The control device has the structure glass/ITO/P3HT:PCBM/LiF/Al.

As discussed above, to prepare the active BHJ layer, an o-dichlorobenzene (ODCB) solution of P3HT and PCBM was spin-coated onto the ITO/NiO surface to form an active film (layer) in the glove box. Within the glove box, the film was annealed and device fabrication completed by vapor-depositing LiF and then the Al cathode. Preliminary optimization of the p-type NiO interlayer for maximizing the OPV performance was carried out by varying the $O_2$ partial pressure during the film growth, and the optimal $O_2$ partial pressure was found to be about $7.0 \times 10^{-4}$ Torr. The effect of the NiO film thickness on the device response was investigated in the relation of current density and voltage (J-V), as shown in FIG. 7, where curves 720, 730, 740, 750 and 760 are corresponding to the current density-voltage (J-V) plots for glass/ITO/NiO/P3HT:PCBM/LiF/Al BHJ solar cells having the NiO layer fabricated with varying layer thicknesses, 5 nm, 10 nm, 20 nm, 43 nm and 77 nm, respectively. The J-V plot of the control device having the BHJ structure glass/ITO/P3HT:PCBM/LiF/Al is shown by curve 710. As shown in FIG. 7, there is a clear trend of decreasing cell efficiency with increasing NiO thickness.

Figure 8:
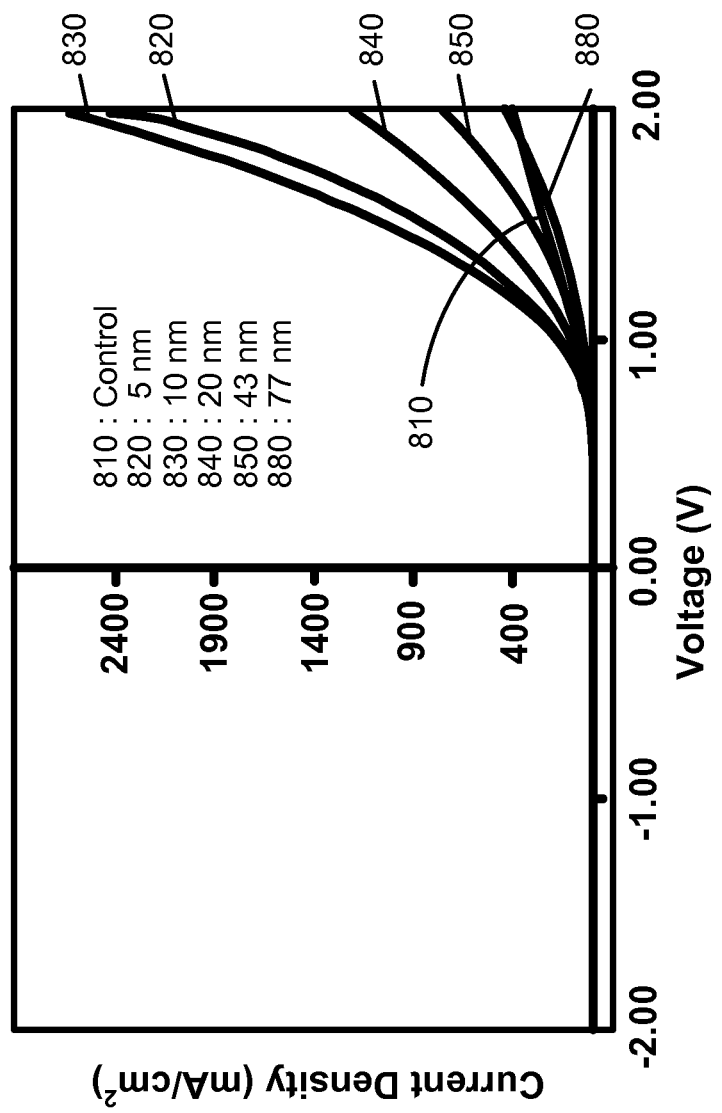
FIG. 8 shows dark J-V plots for BHJ solar cells having an NiO layer with various thickness and the control device that contains no NiO interfacial layer.

FIG. 8 shows dark J-V plots for BHJ solar cells having an NiO layer with various thickness and the control device that contains no NiO interfacial layer. Curves 820, 830, 840, 850 and 860 are corresponding to the dark J-V plots for glass/ITO/NiO/P3HT:PCBM/LiF/Al BHJ solar cells having the NiO layer fabricated with varying layer thicknesses, 5 nm, 10 nm, 20 nm, 43 nm and 77 nm, respectively. Curve 810 is the dark J-V plot of the control device having the BHJ structure glass/ITO/P3HT:PCBM/LiF/Al.

Figure 9:
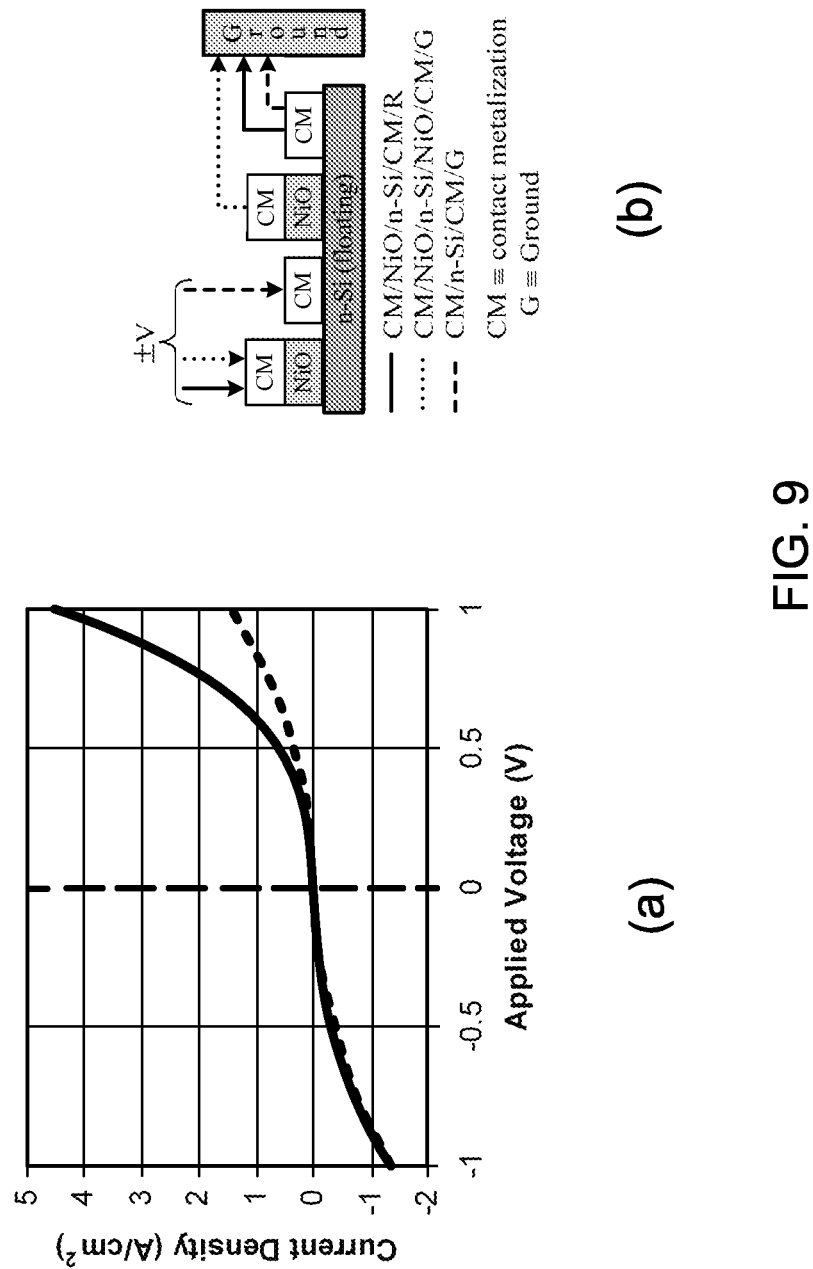
FIG. 9 shows (a) J-V plots for p-NiO/n-Si MIS devices and (b) a schematic of the device structure.

Series resistance and incident photon absorption by NiO are likely the dominant factors. The resistivity of the NiO films measured perpendicular to the plane of the substrate is in the range of $10^6$-$10^7$ Ω·cm as estimated from the change in series resistance with NiO film thickness for the invented solar cell structures. The in-plane resistance for these films was greater than the measurement limit of the Hall apparatus (6 MΩ/□), so a p-n diode structure was fabricated and the current-voltage (I-V) characteristics measured to verify that the NiO films were p-type, as shown in FIG. 9. Contact to the n-type Si was ohmic contact. The NiO/n-Si structure exhibits an I-V curve typical of a p-n diode with a leakage current. Moreover, the NiO/n-Si/NiO structure exhibits an I-V curve of a p-n-p junction as expected.

Figure 10:
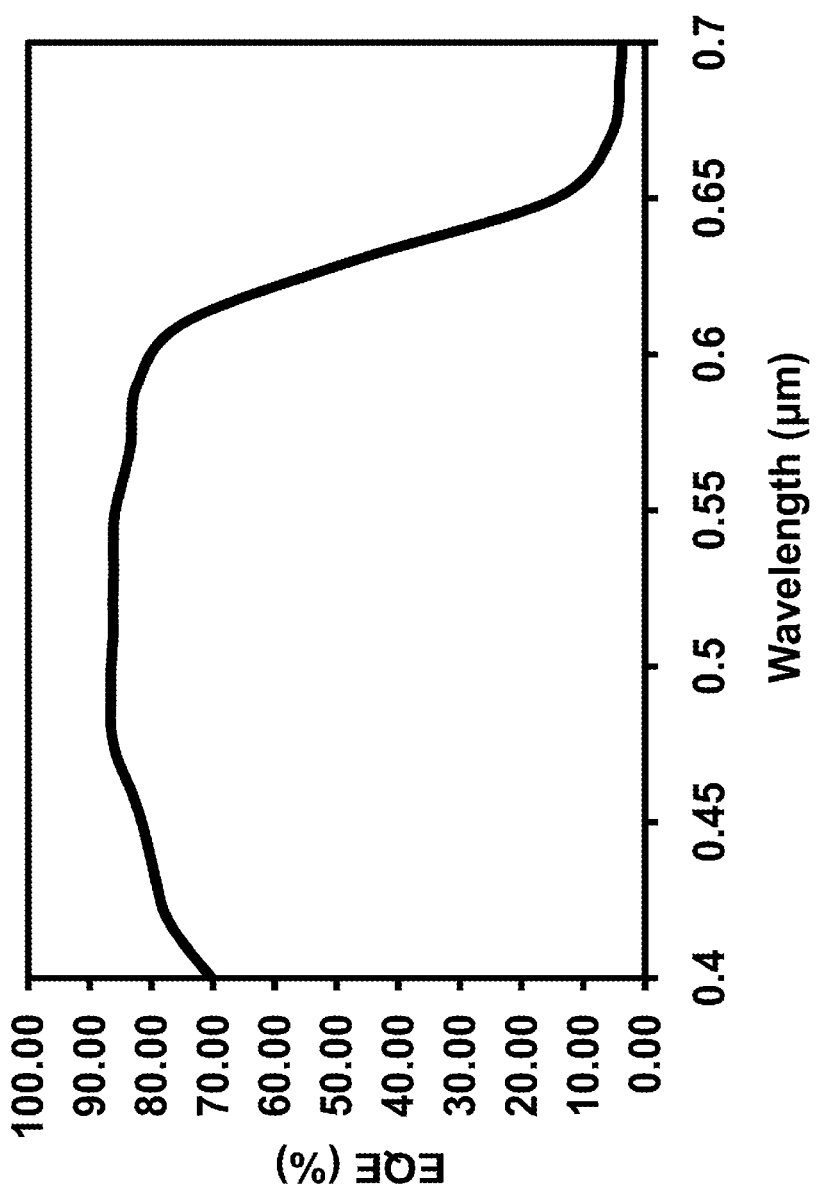
FIG. 10 shows absolute power response for an ITO/NiO(10 nm)/P3HT:PCBM/LiF/Al solar cell (device) based on AM1.5G-159 solar spectrum. The external quantum efficiency maximum is about 87%.

The optimal NiO interlayer thickness is found to be about 5-10 nm, where an 80% increase in the PCE versus the control was observed. Additionally, inclusion of a 10 nm NiO layer in the solar celld results in a slight increase (6%) in $J_{sc}$, a 24% increase in $V_{oc}$, and 37% increase in FF versus that of the control device. FIG. 10 shows the absolute power response for an ITO/NiO(10 nm)/P3HT:PCBM/LiF/Al solar cell based on AM1.5G-159 solar spectrum. External quantum efficiency (EQE) was measured on the device containing the 10 nm NiO layer and was found to reach a maximum of 87% for a light wavelength between 400 and 700 nm.

Response parameters for the NiO interlayer-based solar cells are summarized in Table 1 along with a community-standard device having the structure glass/ITO/PEDOT:PSS/-P3HT:PCBM/LiF/Al. The largest PCE measured was about 5.2%, which was confirmed by the National Renewable Energy Laboratory (NREL). Table 1: Response parameters for the glass/ITO/interlayer/P3HT:PCBM/LiF/Al BHJ photovoltaic solar cells in FIG. 6. The control device has the structure glass/ITO/P3HT:PCBM/LiF/Al. Interlayers in device column are deposited directly onto ITO layer

| Device | $V_{oc}$ (V) | $J_{sc}$ (mA/cm$^2$) | FF (%) | Eff (%) |
|---|---|---|---|---|
| 40 nm PEDOT:PPS | 0.624 | 9.54 | 40.4 | 2.40 |
| Control (w/o NiO) | 0.515 | 10.7 | 50.7 | 2.87 |
| 5 nm NiO | 0.634 | 11.5 | 63.3 | 4.75 |
| 10 nm NiO | 0.638 | 11.3 | 69.3 | 5.16 |
| 20 nm NiO | 0.591 | 8.83 | 55.2 | 2.96 |
| 43 nm NiO | 0.586 | 8.09 | 52.4 | 2.55 |
| 77 nm NiO | 0.0.581 | 7.49 | 49.8 | 2.23 |

Figure 11:
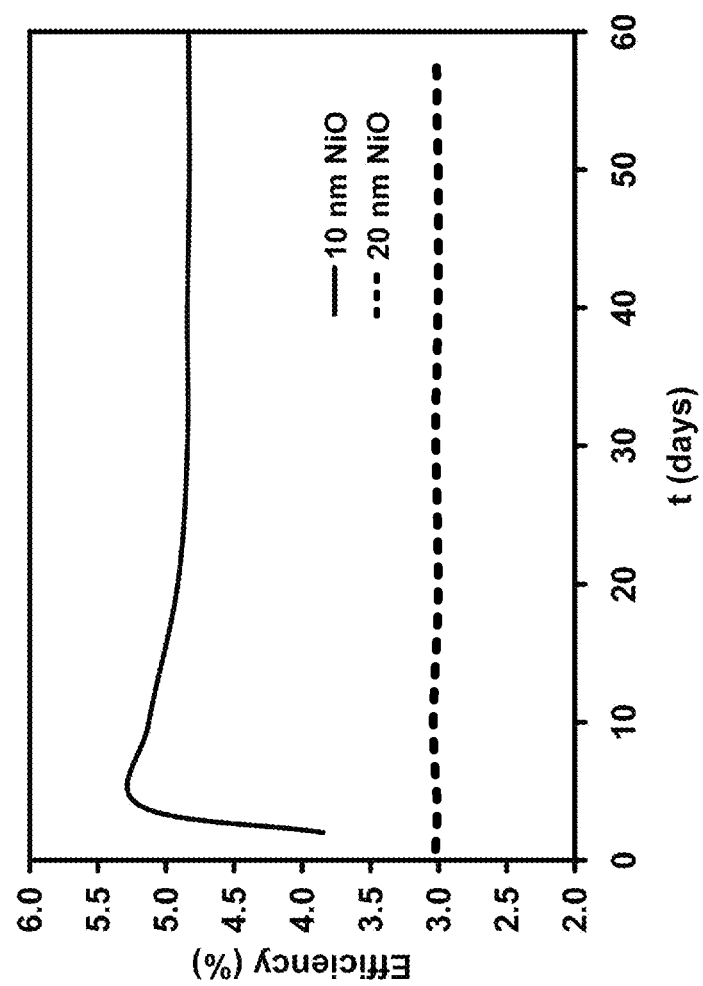
FIG. 11 shows temporal response characteristics of a BHJ solar cell with an NiO anode layer having a thickness of 10 nm (solid) and 20 nm (dashed) formed on an ITO anode.

An essential requirement for an effective OPV anode interfacial layer is that it provides a temporally durable device. At the NiO interlayer thicknesses of 5 nm and 10 nm, a "break-in" period is observed, which is common in organic light-emitting diodes, where the device response increases over the first few days after fabrication. It is hypothesized that these changes reflect active layer phase separation/reconstruction [10, 19] or polymer diffusion into the NiO grain boundaries, thus increasing the available surface area for charge collection. The performance of the solar cell with a 10 nm NiO interlayer reaches a maximum of about 5.2% PCE and then slowly declines with continuous testing under AM1.5G radiation to about 4.7%, where it remains essentially constant, as shown in FIG. 11. Although data are not shown, devices with a 5 nm NiO interlayer exhibit negligible temporal decay from a maximum PCE≈4.7% over the same time period. A solar cell with a 20 nm NiO interlayer or a thicker NiO interlayer display flat device performance and no decay over time with continuous testing.

The reported optical band-gap of NiO ranges from 3.4 eV [47] to 4.3 eV [38] depending exactly on how the location of the band edge is defined: location of the first absorption feature, midpoint of the first rise, or where the maximum slope of absorption extrapolates to zero [38]. In this contribution, the optical band-gap is determined from a standard plot of $(\alpha h v)^2$ vs. hv where $\alpha$ is the absorption coefficient and hv is energy in eV; the x-axis intercept of the linear portion of the plot is then taken as the optical band-gap. This yields a slightly lower value for the band-gap (3.6 eV) but as shown, even at the measured value, the band-gap is more than sufficient to serve as an effective electron-blocking layer, as shown in FIG. 2b. Note that some absorption in the visible range occurs due to low oscillator strength d-d interband transitions [37, 48], however, the overall transparencies of these thin NiO films are quite high, as shown in FIG. 6. The reported $E_f$ for undoped NiO ranges from 3.8 eV [49] to 5.4 eV [50] and has been found to be dependent on the deposition substrate [51] and the NiO surface treatment [49]. A frequently cited value is 5.0 eV [20, 23, 44, 52] while the valence band maximum (VBM) of undoped NiO is about 0.4 eV below $E_f$ [52, 53]. In the BHJ solar cell according to embodiments of the present invention, NiO functions as both a hole-transport and an electron-blocking layer. Due to the essentially ohmic contact between NiO and P3HT, as sown in FIG. 2b, a large Schottky barrier is not formed, allowing holes to freely transfer from the active layer to the $Ni^{2+}$ vacancy-based (excess O) hole-conducting anode band. The VBM of NiO is about 0.4 eV below the Fermi level ($E_f$=5.0 eV) and with a NiO band-gap of about 3.6 eV, the conduction band energy is about 1.8 eV, while the LUMOs of P3HT and PCBM are at 3.0 and 4.0 eV, respectively. This energetic ordering should provide a 1.2-2.2 eV barrier to electron collection at the anode. These level energetics are important because the donor and acceptor materials are both in contact with the electrodes in BHJ cells, and it is energetically favorable for an electron from the PCBM LUMO to be collected at the anode (here the ITO work function ($\Phi$) is about 4.7 eV). This electron flow opposes the built-in field created by the differences in the anode and cathode work functions (Al, $\Phi$=4.2 eV) and this, in turn, creates an opposing field and an overall decrease in positive cell potential (a decrease in $V_{oc}$).

The P3HT HOMO lies at 5.0 eV, while the PCBM LUMO lies at 4.0 eV. Thus, the theoretical maximum $V_{oc}$ for this type of P3HT-PCBM BHJ cell is 1.0 V (energy levels were determined by thin-film solution cyclic voltammetry), but without any anode interfacial layer, the experimental $V_{oc}$ is commonly near 0.50 V, representing a 500 mV loss. Importantly, the 10 nm NiO EBL recovers about 140 mV of the lost potential by increasing $V_{oc}$ 40% from 0.515 V of the control device to 0.638 V. The effectiveness of the NiO EBL can doubtlessly be improved by further optimizing growth conditions, since the present layer was found to be somewhat "leaky" in metal-insulator-semiconductor structures. This further increase the $V_{oc}$.

The present invention, among other thing, disclose a BHJ solar cell having a p-type oxide semiconductor interfacial layer that results in a dramatic performance increase, while exhibiting excellent device stability. In one embodiment, inserting a 5-10 nm p-type NiO interfacial layer in a P3HT: PCBM BHJ solar cell increases the performance to 5.2% power conversion efficiency, which is extendable to other p-type materials of appropriate work function. These results also highlight the general importance of suppressing OPV interfacial losses, and their adverse effects on $V_{oc}$ and power conversion efficiency.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1] Morton, O. (2006) *Nature* (London, United Kingdom) 443, 19-22.

[2] Lira-Cantu, M. & Krebs, F. C. (2005) *Recent Res Devel App Physics* 8, 71-98.

[3] Dennler, G., Lungenschmied, C., Neugebauer, H., Sariciftci, N. S., & Labouret, A. (2005) *J Mat Res* 20, 3224-3233.

[4] Gledhill, S. E., Scott, B., & Gregg, B. A. (2005) *J Mat Res* 20, 3167-3179.

[5] Coakley, K. M., Liu, Y., Goh, C., & McGehee, M. D. (2005) *MRS Bull* 30, 37-40.

[6] Grätzel, M. (2005) *MRS Bull* 30, 23-27.

[7] Shaheen, S. E., Ginley, D. S., & Jabbour, G. E. (2005) *MRS Bull* 30, 10-19.

[8] Guenes, S., Neugebauer, H., & Sariciftci, N. S. (2007) *Chem Rev* (Washington, DC, United States) 107, 1324-1338.

[9] Kuang, D., Klein, C., Ito, S., Moser, J.-E., Humphry-Baker, R., Evans, N., Duriaux, F., Grätzel, C., Zakeeruddin, S. M., & Grätzel, M. (2007) *Advan Mater* (Weinheim, Germany) 19, 1133-1137.

[10] Li, G., Shrotriya, V., Huang, J., Yao, Y., Moriarty, T., Emery, K., & Yang, Y. (2005) *Nat Mat* 4, 864-868.

[11] Mutolo, K. L., Mayo, E. I., Rand, B. P., Forrest, S. R., & Thompson, M. E. (2006) *J Am Chem Soc* 128, 8108-8109.

[12] Scharber, M. C., Muehlbacher, D., Koppe, M., Denk, P., Waldauf, C., Heeger, A. J., & Brabec, C. J. (2006) *Advan Mater* (Weinheim, Germany) 18, 789-794.

[13] Chen, T. A. & Rieke, R. D. (1992) *J Am Chem Soc* 114, 10087-10088.

[14] Hummelen, J. C., Knight, B. W., LePeq, F., Wudl, F., Yao, J., & Wilkins, C. L. (1995) *J Org Chem* 60, 532-538.

[15] Inoue, K., Ulbricht, R., Madakasira, P. C., Zhou, M., Lee, S. B., Ferraris, J., & Zakhidov, A. A. (2005) *Mat Res Soc Sympos Proc* 836, 69-74.

[16] Kim, K. (2007) *Appl Phys Lett* 90, 163511.

[17] Li, G., Shrotriya, V., Yao, Y., & Yang, Y. (2005) *J Appl Phys* 98, 043704/043701-043704/043705.

[18] Reyes-Reyes, M., Kim, K., & Carroll, D. L. (2005) *Appl Phys Lett* 87, 083506/083501-083506/083503.

[19] Yang, X., Loos, J., Veenstra Sjoerd, C., Verhees Wiljan, J. H., Wienk Martijn, M., Kroon Jan, M., Michels Matthias, A. J., & Janssen Rene, A. J. (2005) *Nano Leterst* 5, 579-583.

[20] Chan, I. M., Hsu, T.-Y., & Hong, F. C. (2002) *Appl Phys Lett* 81, 1899-1901.
[21] Huang, Q., Evmenenko, G., Dutta, P., & Marks, T. J. (2003) *J Am Chem Soc* 125, 14704-14705.
[22] Huang, Q., Evmenenko, G. A., Dutta, P., Lee, P., Armstrong, N. R., & Marks, T. J. (2005) *J Am Chem Soc* 127, 10227-10242.
[23] Im, H. C., Choo, D. C., Kim, T. W., Kim, J. H., Seo, J. H., & Kim, Y. K. (2007) *Thin Solid Films* 515, 5099-5102.
[24] Yan, H., Lee, P., Armstrong, N. R., Graham, A., Evmenenko, G. A., Dutta, P., & Marks, T. J. (2005) *J Am Chem Soc* 127, 3172-3183.
[25] Derouiche, H. & Djara, V. (2007) *Sol Energy Mater Sol Cells* 91, 1163-1167.
[26] Forrest, S. R. (2006) *Polym Mater Sci Eng* 95, 160.
[27] Koster, L. J. A., Mihailetchi, V. D., de Boer, B., & Blom, P. W. M. (2006) *SPIE Proc* 6192, 61920A/61921-61920A/61929.
[28] Moliton, A. & Nunzi, J.-M. (2006) *Polymer Int* 55, 583-600.
[29] Hains, A. W., Martinson, A. B. F., Irwin, M. D., Yan, H., & Marks, T. J. (2007) *Polym Mater Sci Eng* 96, 814-815.
[30] Kim, Y.-H., Lee, S.-H., Noh, J., & Han, S.-H. (2006) *Thin Solid Films* 510, 305-310.
[31] Ni, J., Yan, H., Wang, A., Yang, Y., Stern, C. L., Metz, A. W., Jin, S., Wang, L., Marks, T. J., Ireland, J. R., et al. (2005) *J Am Chem Soc* 127, 5613-5624.
[32] Kemerink, M., Timpanaro, S., De Kok, M. M., Meulenkamp, E. A., & Touwslager, F. J. (2004) *J Phys Chem B* 108, 18820-18825.
[33] Ionescu-Zanetti, C., Mechler, A., Carter, S. A., & Lal, R. (2004) *Advan Mater* (Weinheim, Germany) 16, 385-389.
[34] Shrotriya, V., Li, G., Yao, Y., Chu, C.-W., & Yang, Y. (2006) *Appl Phys Lett* 88, 073508/073501-073508/073503.
[35] Takahashi, K., Suzaka, S., Sigeyama, Y., Yamaguchi, T., Nakamura, J.-I., & Murata, K. (2007) *Chem Lett* 36, 762-763.
[36] White, M. S., Olson, D. C., Shaheen, S. E., Kopidakis, N., & Ginley, D. S. (2006) *Appl Phys Lett* 89, 143517/143511-143517/143513.
[37] Fujimori, A. & Minami, F. (1984) *Phys Rev B* 30, 957-971.
[38] Huefner, S. (1994) *Advan Phys* 43, 183-356.
[39] Pizzini, S. & Morlotti, R. (1967) *J Electrochem Soc* 114, 1179-1189.
[40] Gledel, C., Audiere, J. P., & Clement, R. (1989) *J Mater Sci* 24, 2493-2496.
[41] Hardee, K. L. & Bard, A. J. (1977) *J Electrochem Soc* 124, 215-224.
[42] Werfel, F. & Minni, E. (1983) *J Phys C* 16, 6091-6100.
[43] Adler, D. & Feinleib, J. (1970) *Phys Rev B* [3]2, 3112-3134.
[44] Schmahl, N. G., Barthel, J., & Eikerling, G. F. (1964) *Z Anorgan Allgem Chem* 332, 230-237.
[45] Wittenauer, M. A. & Van Zandt, L. L. (1982) *Philosoph Mag B* 46, 659-667.
[46] Lany, S., Osorio-Guillen, J., & Zunger, A. (2007) *Phys Rev B* 75, 241203/241201-241203/241204.
[47] Patil, P. S. & Kadam, L. D. (2002) *Appl Surf Sci* 199, 211-221.
[48] Ohta, H., Kamiya, M., Kamiya, T., Hirano, M., & Hosono, H. (2003) *Thin Solid Films* 445, 317-321.
[49] McKay, J. M. & Henrich, V. E. (1985) *Phys Rev B* 32, 6764-6772.
[50] Madjid, A. H. & Martinez, J. M. (1972) *Phys Rev Lett* 28, 1313-1315.
[51] Nakasa, A., Adachi, M., Usami, H., Suzuki, E., & Taniguchi, Y. (2006) *Thin Solid Films* 498, 240-243.
[52] Nakaoka, K., Ueyama, J., & Ogura, K. (2004) *J Electroanal Chem* 571, 93-99.
[53] Huefner, S., Steiner, P., Sander, I., Reinert, F., Schmitt, H., Neumann, M., & Witzel, S. (1991) *Solid State Commun* 80, 869-873.
[54] Shrotriya, V., Li, G., Yao, Y., Moriarty, T., Emery, K., & Yang, Y. (2006) *Advan Funct Mater* 16, 2016-2023.

What is claimed is:

1. A solar cell, comprising:
   (a) a transparent substrate;
   (b) a tin-doped indium oxide (ITO) anode formed on the transparent substrate;
   (c) a nickel(II) oxide (NiO) layer formed on the ITO anode, wherein the NiO layer is a p-type semiconductor layer, and has a thickness of about 5-10 nm;
   (d) an active organic layer formed on the NiO layer, the active organic layer comprising poly(3-hexylthiophene) (P3HT) and [6,6]-phenyl-C61 butyric acid methyl ester (PCBM), wherein the ratio of P3HT to PCBM in the active organic layer is about 1:1 in weight;
   (e) a lithium fluoride (LiF) layer formed on the active organic layer; and
   (f) a metallic cathode formed on the LiF layer, wherein the metallic cathode comprises an aluminum (Al) cathode, wherein the active organic layer is adapted such that when photo excited the active organic layer transports holes towards the ITO anode and transports electrons towards the cathode; and
   wherein the NiO layer is adapted such that the NiO layer blocks electrons leakage from the active organic layer to the anode and transports holes from the active organic layer to the anode.

2. The solar cell of claim 1, wherein the NiO layer is transparent and adapted for blocking electrons leakage from the active organic layer to the ITO anode while transporting holes from the active organic layer to the ITO anode.

3. The solar cell of claim 1, wherein the ITO anode includes at least first two strips that are spatially separated, and the metallic cathode includes at least second two strips that are spatially separated and that are perpendicular to the first two strips.

* * * * *